(12) United States Patent
Hwang et al.

(10) Patent No.: US 7,826,579 B2
(45) Date of Patent: Nov. 2, 2010

(54) METHOD AND APPARATUS FOR GENERATING SYNCHRONIZATION SIGNALS FOR SYNCHRONIZING MULTIPLE CHIPS IN A SYSTEM

(75) Inventors: Charlie C. Hwang, Hopewell Junction, NY (US); Wiren D. Becker, Hyde Park, NY (US); Timothy G. McNamara, Fishkill, NY (US); Ching-Lung Tong, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 1270 days.

(21) Appl. No.: 11/363,871

(22) Filed: Feb. 28, 2006

(65) Prior Publication Data

US 2006/0182212 A1 Aug. 17, 2006

Related U.S. Application Data

(63) Continuation-in-part of application No. 11/056,767, filed on Feb. 11, 2005, now Pat. No. 7,382,844.

(51) Int. Cl.
*H04L 7/00* (2006.01)
(52) U.S. Cl. .................. 375/354; 375/357; 375/362; 375/365; 375/368; 375/371; 375/373; 375/376
(58) Field of Classification Search .............. 375/354, 375/355, 362, 368, 373, 376
See application file for complete search history.

(56) References Cited

U.S. PATENT DOCUMENTS

| | | | | | |
|---|---|---|---|---|---|
| 5,850,414 | A | * | 12/1998 | Miyajima | ............. 375/150 |
| 6,665,359 | B1 | * | 12/2003 | Flake | ................. 375/354 |
| 6,792,554 | B2 | * | 9/2004 | Gervais et al. | ...... 713/600 |
| 6,819,726 | B2 | * | 11/2004 | Drerup et al. | ....... 375/371 |
| 2003/0091137 | A1 | * | 5/2003 | Vallet et al. | ......... 375/360 |

* cited by examiner

*Primary Examiner*—Shuwang Liu
*Assistant Examiner*—Dhaval Patel
(74) *Attorney, Agent, or Firm*—Cantor Colburn LLP; William Kinnaman, Jr.

(57) ABSTRACT

A clock generator circuit for generating synchronization signals for a multiple chip system. The clock generator circuit comprises generation of a synchronization signal from a reference clock and chip global clock with edge detection logic. In high performance server system design with multiple chips, a common practice for server systems is to use feedback clock and delayed reference clock to generate the synchronization signal. The generated synchronization signal is transferred to latches clocked by the global clock to be used for chip synchronization functions. As the system clock frequency is pushed higher, the phase difference between generated synchronization signal clocked by feedback clock and receiving latch clocked by global clock is becoming such a large portion of cycle time that this signal cannot be transferred deterministically. This invention resolves the uncertainty problem and allows the synchronization signals to be generated deterministically independent of the chip global clock cycle time.

5 Claims, 11 Drawing Sheets

Figure 6a:
when td is larger than one minimum clkg cycle

Figure 6b
when td is unchanged from figure 6a, but clkg cycle time increases

METHOD AND APPARATUS FOR GENERATING SYNCHRONIZATION SIGNALS FOR SYNCHRONIZING MULTIPLE CHIPS IN A SYSTEM

CROSS-REFERENCE TO RELATED APPLICATIONS

This is a continuation in part of commonly assigned, U.S. patent application Ser. No. 11/056,767 filed Feb. 11, 2005 now U.S. Pat. No. 7,382,844 for Methods to Self-synchronize Clocks on Multiple Chips in a System.

BACKGROUND

1. Field of the Invention

Figure 1:
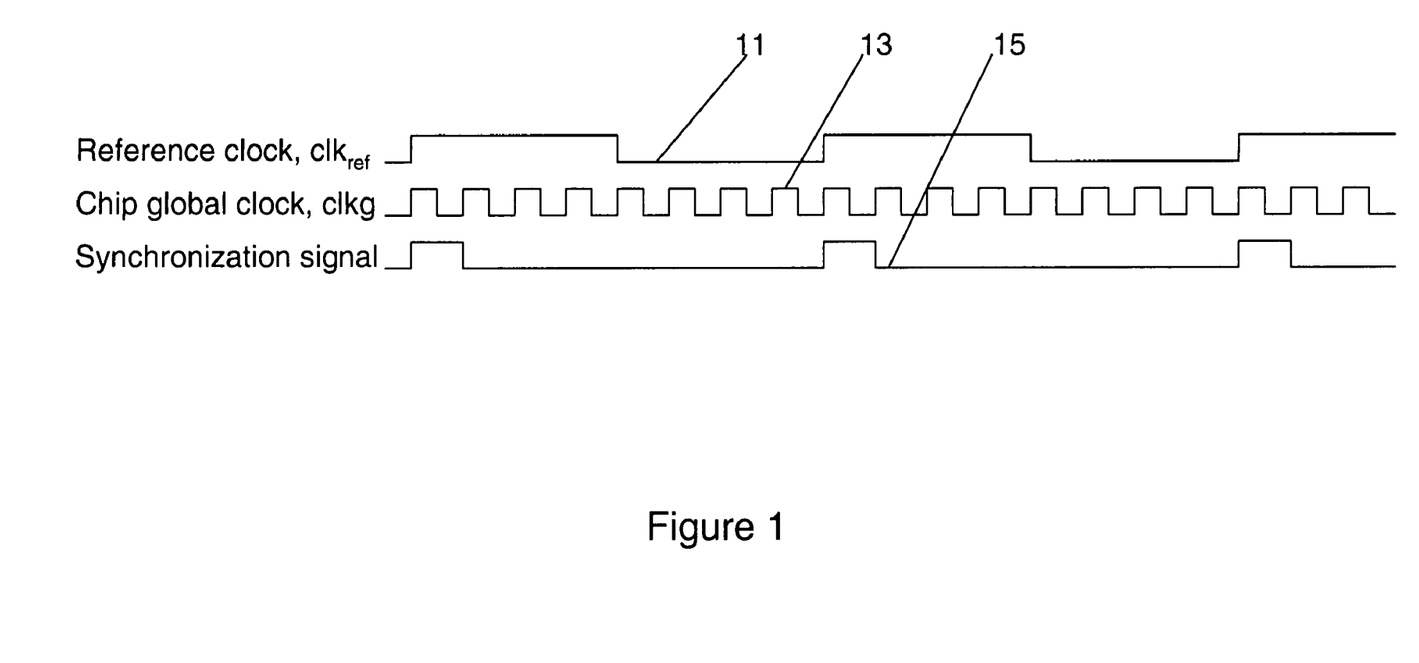
FIG. 1 illustrates one example of the synchronization signal, with a PLL multiplication ratio of 8.

This invention relates to methods to self-synchronize clocks on multiple chips in a system 2. Description of Background In a synchronous digital system comprised of multiple chips with synchronous communications among them, cross-chip functions often require a synchronized "time-zero" over a certain predefined number of clock cycles. To properly synchronize the time-zero of all the chips in the same system, a method is required to synchronize the counters that keep track of the "time-zero" on all the chips. One way to accomplish this is through the methods described in patent application Ser. No. 11/056,767, Methods to Self-synchronize Clocks on Multiple Chips in a System. All of the synchronization methods described therein rely on a synchronization signal generated off of the input reference clock and a PLL-generated global clock of the chip. This is as shown in the example in FIG. 1. These signals include a reference clock signal $clk_{ref}$ 11, a chip global clock signal, clkg 13 and a synchronization signal 15.

SUMMARY OF THE INVENTION

Figure 2:
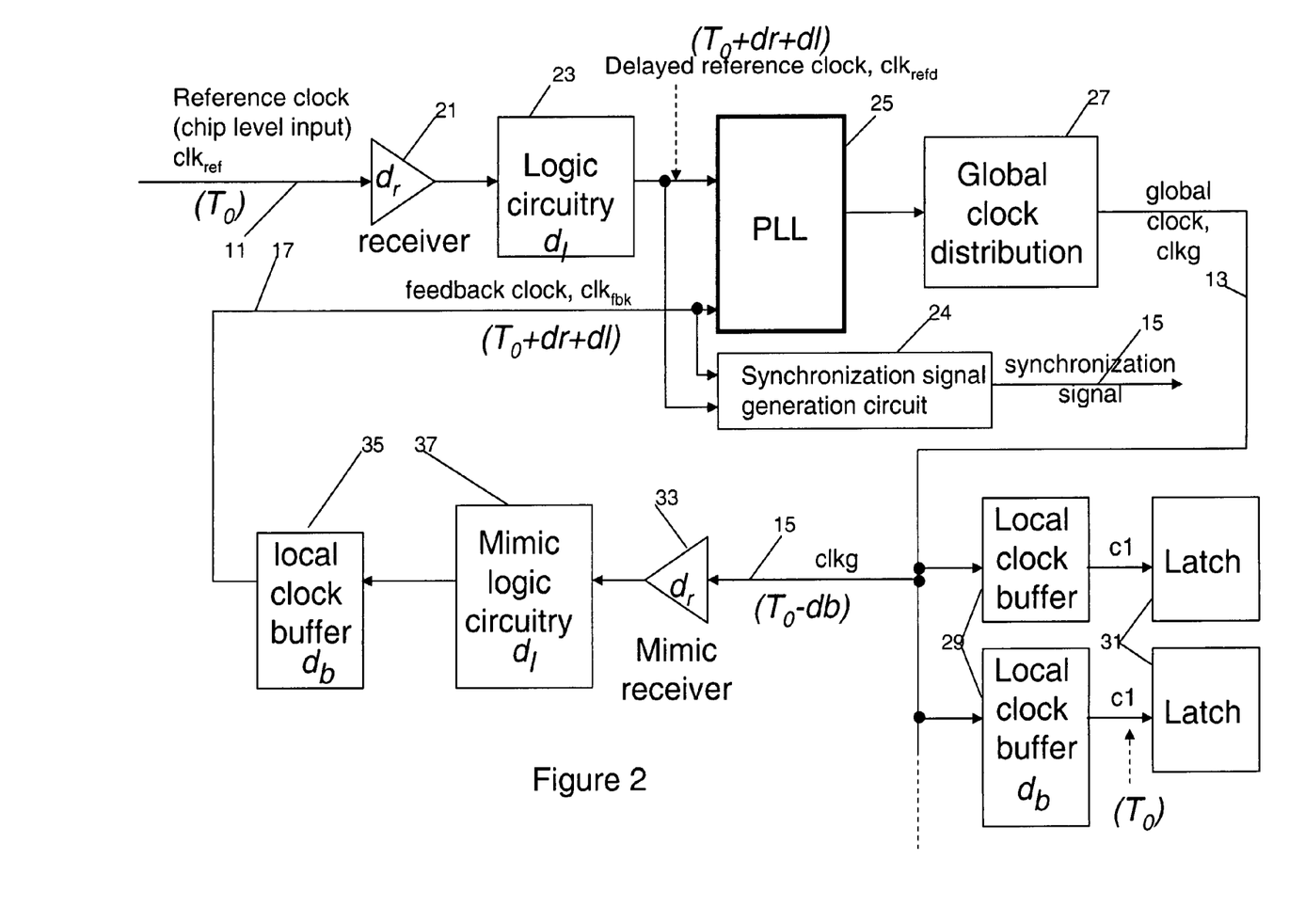
FIG. 2 illustrates one example of a synchronization signal generation with delayed reference clock and feedback clock.

The generation of the synchronization signal from reference clock and chip global clock may be done with edge detection logic at slower frequency. In high performance server system design with multiple chips, a common practice for server systems is to use feedback clock, $clk_{fbk}$ 17 and delayed reference clock, to generate the synchronization signal as shown in FIG. 2. This is because the phases of these two clocks are known to align well to each other. The synchronization generation logic may be embedded in the PLL 25 design to work with other aspects of PLL functions. The feedback clock path includes a mimic receiver 33, mimic logic 35, and mimic local clock buffer 37. The purpose of these mimic circuits is to align the phase of local clock buffer output, c1, to the phase of input reference clock 11. The parentheses in FIG. 2 indicate the relative timing to input reference clock at different nodes. By doing so, all the chips in the same system receiving reference clocks with the same phase will have c1 clocks, which clock the latches, phase-aligned to each other. This reduces timing uncertainty in cross-chip communication systems.

The synchronization generation circuit is clocked by feedback clock, clkfbk 17. The generated synchronization signal has to be eventually transferred to latches clocked by the global clock, clkg 13, to be used for chip synchronization functions. The phase mismatch of feedback clock, clkfbk 17, and clkg 13 is equal to the delay of mimic receiver 33, mimic logic 35, and local clock buffer (dr+dl+db) 37. As the system clock frequency is pushed higher and higher, the phase mismatch, dr+dl+db, doesn't scale proportionally and is becoming a larger and larger portion of the clkg 13 cycle time.

In the current generation high performance system, this phase mismatch is approaching the chip cycle time so the synchronization signal cannot be properly transferred from the synchronization signal generation circuit clocked by the feedback clock 17 to the chip logic running on chip global clock 13 without uncertainty. When clock cycle time is long compared to td, which equals dr+dl+db, this extra delay is not a concern for transferring a synchronization signal to latch 1.

Figure 3:
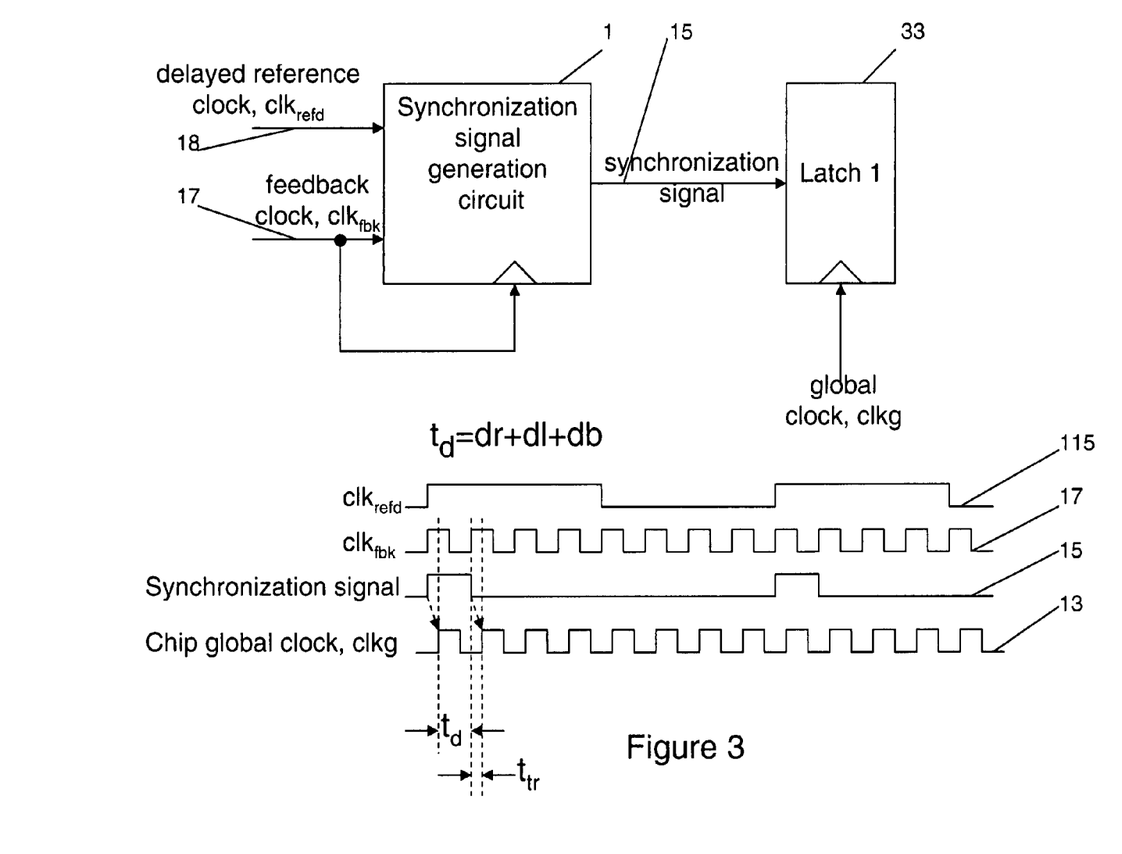
FIG. 3 illustrates one example of data transfer from synchronization circuit to the first latch.

But, as shown in FIG. 3, when the total delay of mimic circuitry in FIG. 2, td, is close to one clkg cycle, there won't be enough time, ttr, for the synchronization signal to be transferred to the first latch. If td is larger than one clkg 13 cycle, we cannot be certain at which clkg 13 cycle latch 1 receives the synchronization signal 15 especially the system may be run at frequencies slower than the maximum target frequency, as will be discussed in details below.

This invention resolves the uncertainty problem and allows the synchronization signals to be generated deterministically independent of the chip global clock cycle time.

Embodiment I

When td, the phase difference between the feedback clock, clkfbk 17, and the chip global clock, clkg 13, is around one clkg cycle and smaller than 1.5 clkg cycles, the first latch 33 that receives the synchronization signal from synchronization signal generation circuit is clocked by inverted feedback clock instead of regular global clock, clkg. A second latch 35 clocked by chip global clock, clkg, 13, is placed near the first latch to receive and send out the synchronization signal 15. This approach effectively gives the first path between the synchronous signal generation circuit and the first latch another 0.5 clkg cycle to transfer the synchronous signal.

Embodiment II

When, td is more than 1.5 times of the minimum global clock cycle time, even the approach used by embodiment I is not adequate to receive the synchronization signal at the second latch, clocked by clkg 13, without uncertainty. Because if the chip could run at slower frequency than the maximum frequency, the cycle relative to clkg 13 that the synchronization signal is latched may be uncertain the chip slows down and the mimic circuitry delay, td, is close to the integral multiple of slowed down clkg cycle time. The solution proposed is to a) Intentionally place the mimic receiver 33 and the local clock buffer 37 at the beginning of the feedback path.

b) Use the delayed clkg 13 from the output of mimic receiver 33/local clock buffer 37 combination and the reference clock from the output of the receiver to generate the synchronization signal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

As a result of the summarized invention, technically we have achieved a solution which resolves clock signal uncertainty and facilitates the synchronization signals to be generated deterministically independent of the chip global clock cycle time.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Embodiment I

Figure 4:
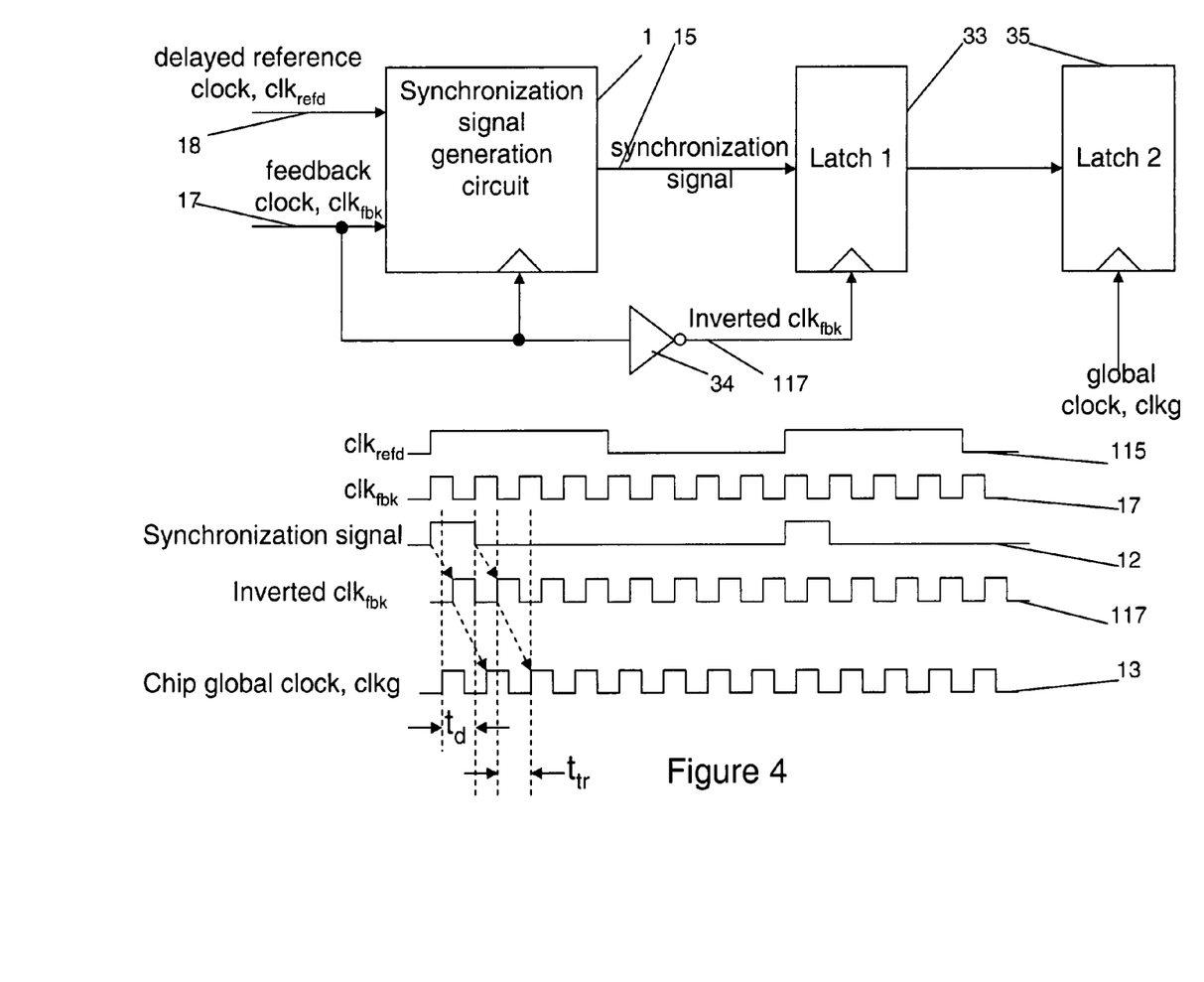
FIG. 4 illustrates one example of using inverted feedback clock to clock latch 1.

When the delay of the mimic circuitry is around 1 clkg cycle but less than 1.5 clkg cycles, the first latch to receive the synchronization signal is placed close to the synchronization signal generation circuit. The feedback is inverted and used to clock latch 1 as shown in FIG. 4. The output from the synchronization signal generation circuit is still launched with feedback clock. Effectively, this scheme borrows 0.5 clkg cycle from the next path between latch 1 and latch 2, so latch 1 to latch 2 becomes a half-cycle path. In physical design, latch 2 also need to be placed close to latch one to allow the half cycle path.

Other variations to this scheme include using inverted feedback clock to clock the synchronization generation circuit as shown in FIG. 7a. By doing so, the path between the launching latches and latch 1 receive one full cycle for signal transfer. This allow additional combinational logic to be added to the path for other functions.

Embodiment II

Figure 6A:
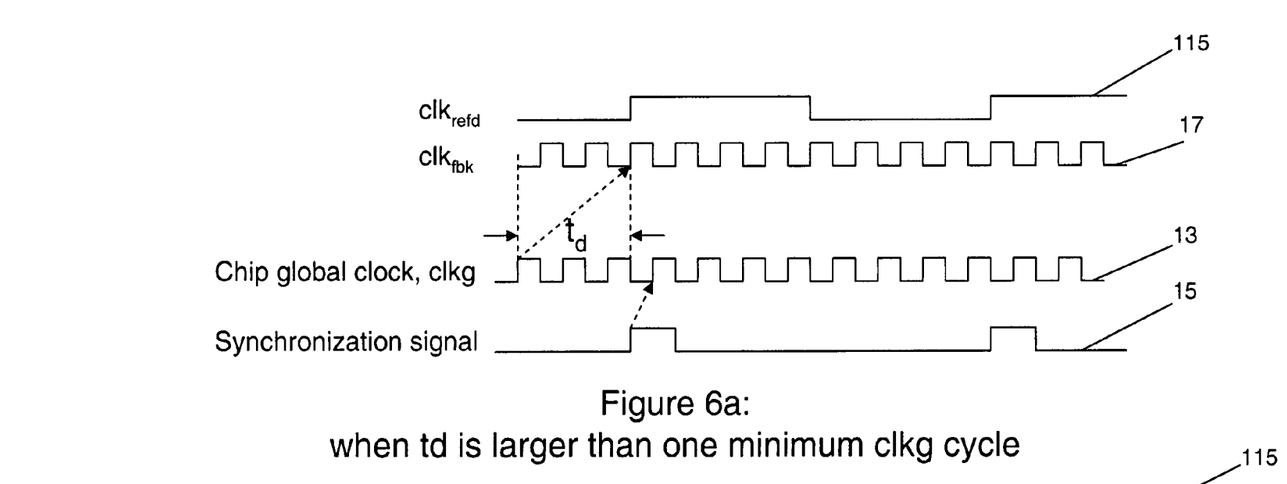
FIG. 6 illustrates one example of the timing relationship of global clock and feedback clock when td is larger than one minimum global clock cycle.
Figure 6B:
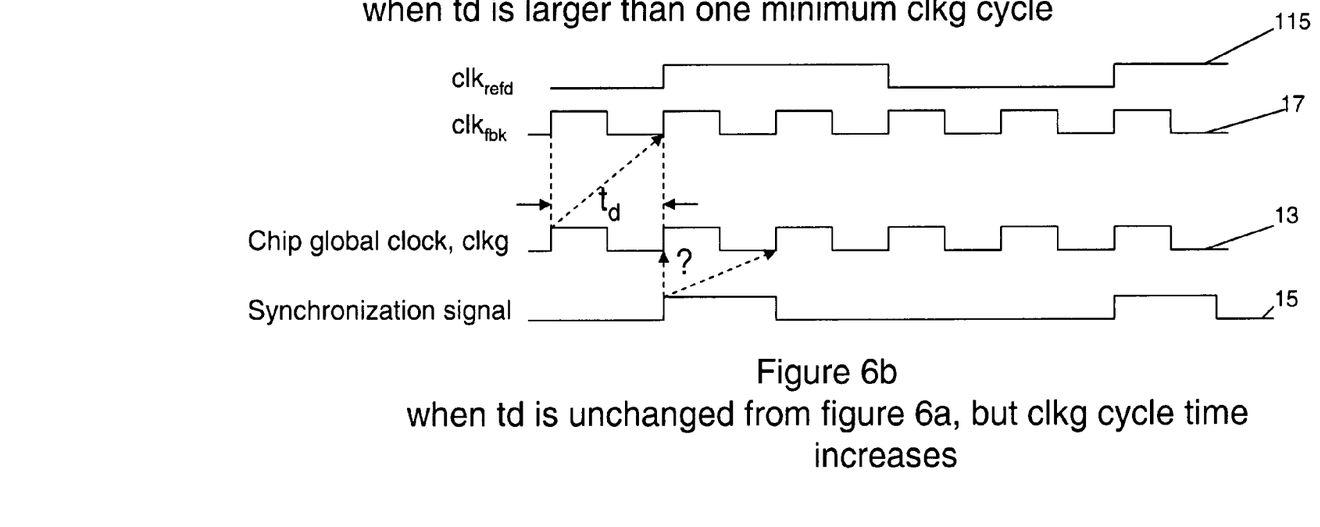

When, td is more than 1.5 times of the minimum global clock cycle time, even the approach used by embodiment I is not adequate to receive the synchronization signal at the second latch, clocked by clkg, without uncertainty. When the chip runs at slower frequency than the maximum frequency, the cycle relative to clkg that the synchronization signal is latched at latch 2 may become uncertain if the mimic circuitry delay, td, is close to the integral multiple of slowed down clkg cycle time as shown in FIG. 6. It is critical that the method used will operate at the maximum frequency and any frequency that is slower than the design frequency. In today's modern processors, the frequency of operation is often slowed down to save power, to prevent over heating, for speed sorting, or for testing. The system must continue to function under these slower frequencies.

Figure 7:
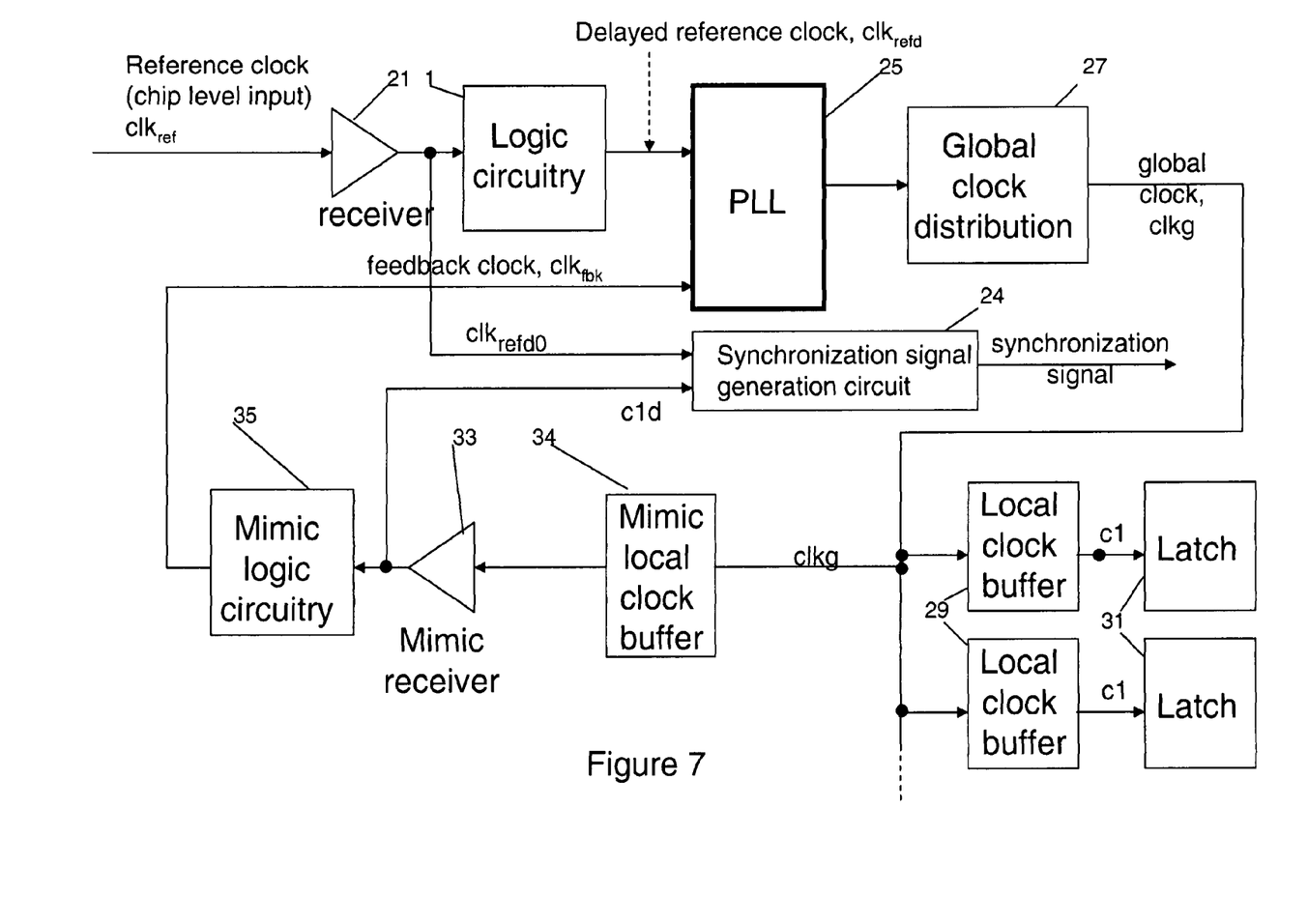
FIG. 7 illustrates one example of synchronization signal generation with reference clock and delayed global clock at receiver output.

To make the design frequency independent, we'll need to generate the synchronization signal with two other clock sources that do not have large phase misalignment with the global clock, clkg. An ideal source will be the reference clock at the output of the receiver since its phase only differs from that of clkg by db+dr. This effectively remove dl, in general the larger portion of mimic circuitry delay, from the phase mismatch. One workable arrangement is to a) Intentionally place the mimic receiver and the local clock buffer at the beginning of the feedback path.

b) Use the delayed clkg from the output of mimic receiver/local clock buffer combination and the reference clock from the output of the receiver to generate the synchronization signal.

as shown in FIG. 7.

Figure 8:
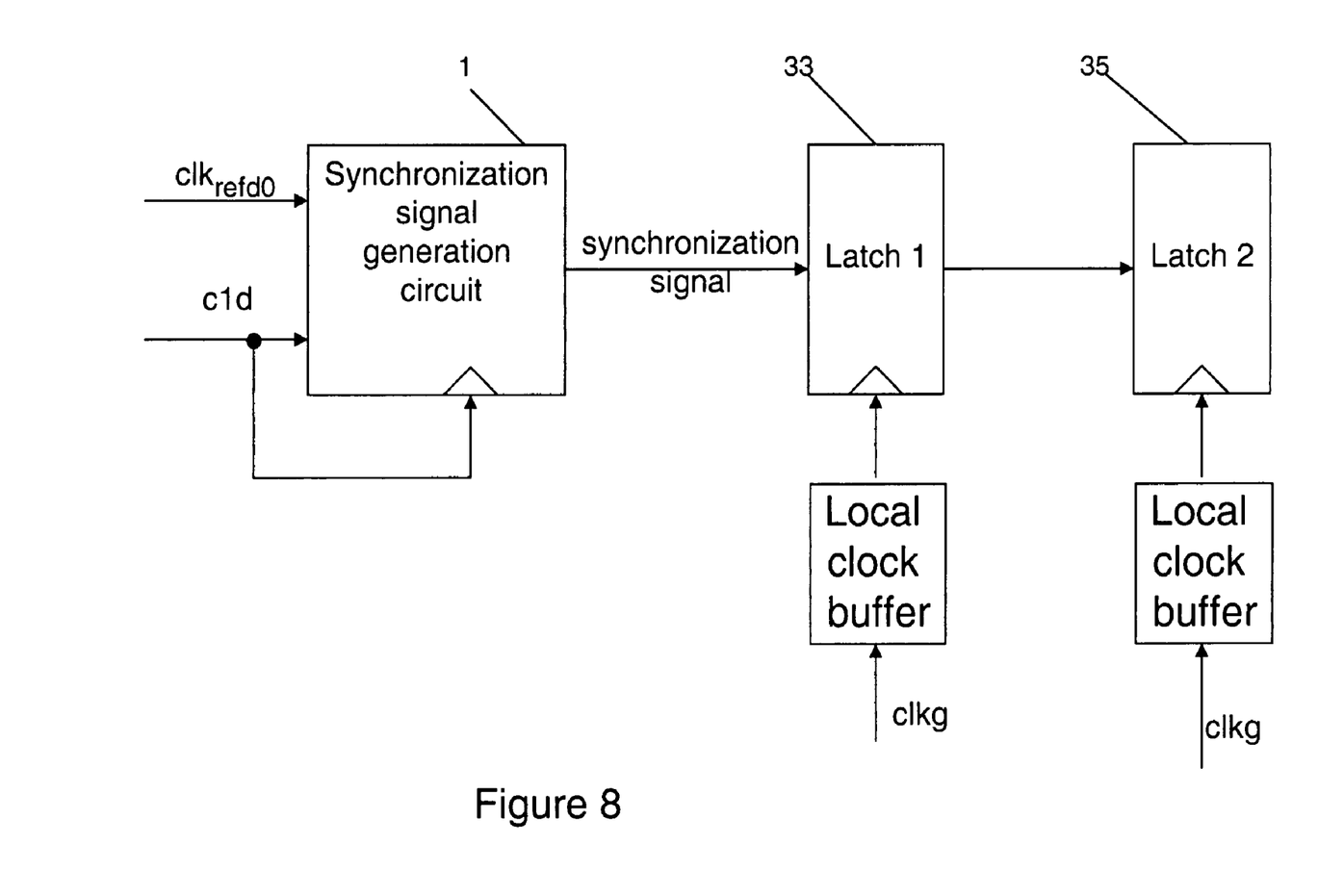
FIG. 8 illustrates one example of synchronization signal transfer with optional local clock buffers.

The phase mismatch between cld and clkg, dr+db, in general is usually small compared to clkg cycle time. To further reduce the mismatch, one can use cld to launch synchronization signal from the synchronization circuit and add local clock buffers for latches at downstream as sown in FIG. 8. This will cut the phase mismatch to only dr.

Figure 5A:
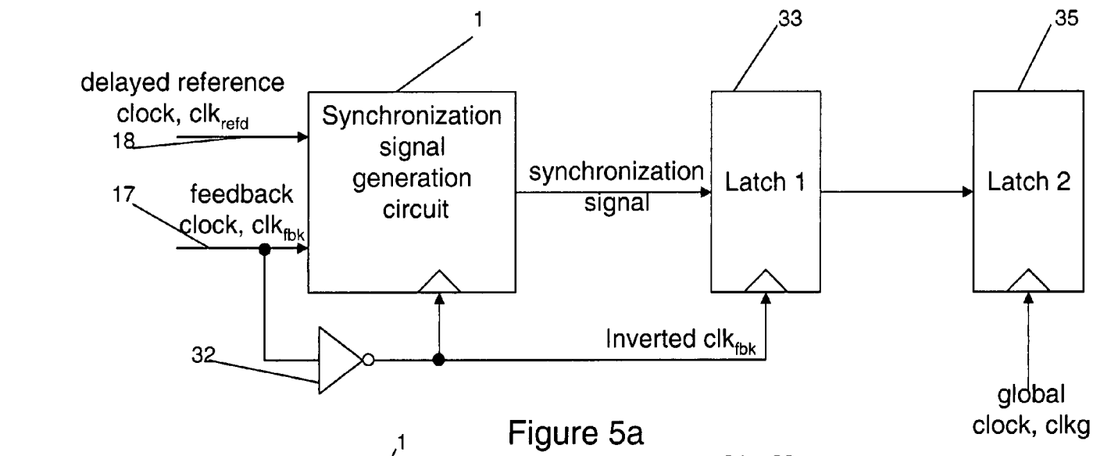
FIGS. 5a and 5b illustrate examples of two synchronization signal generation circuits clocked by inverted feedback clock with optional combination logic.
Figure 5B:
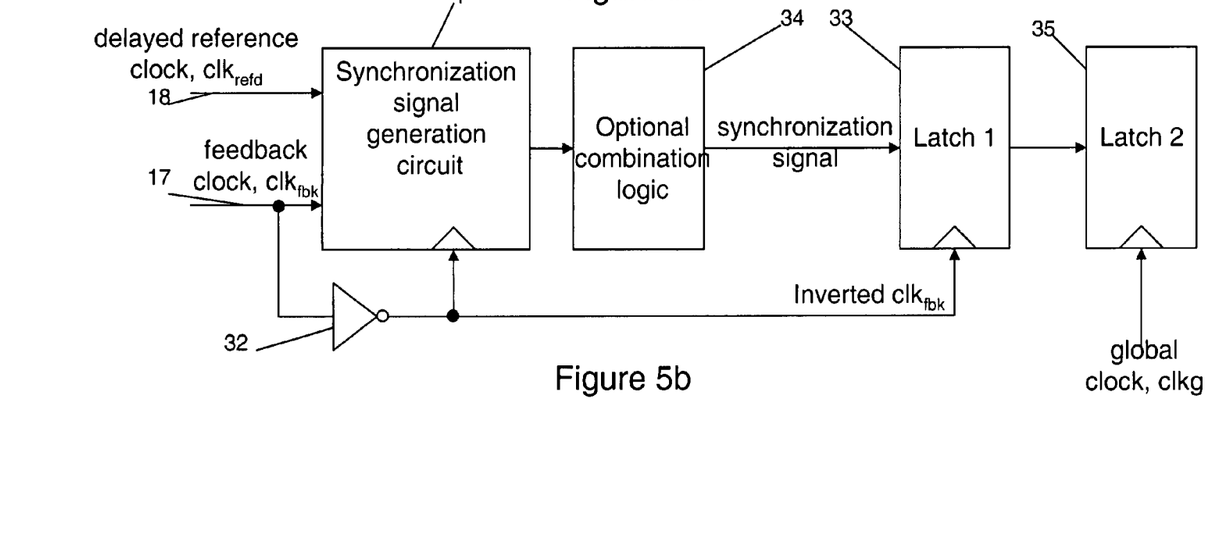

This embodiment can further be combined with embodiment I. If the remaining phase mismatch, dr, has ever become a large portion of the clkg cycle time, one may use the technique described in embodiment I to gain half of clkg cycle for the path between the synchronization generation circuit and latch 1 as shown in FIG. 5, where FIGS. 5a and 5b illustrate examples of two synchronization signal generation circuits clocked by inverted feedback clock with optional combination logic 34 in FIG. 5b.

Figure 9:
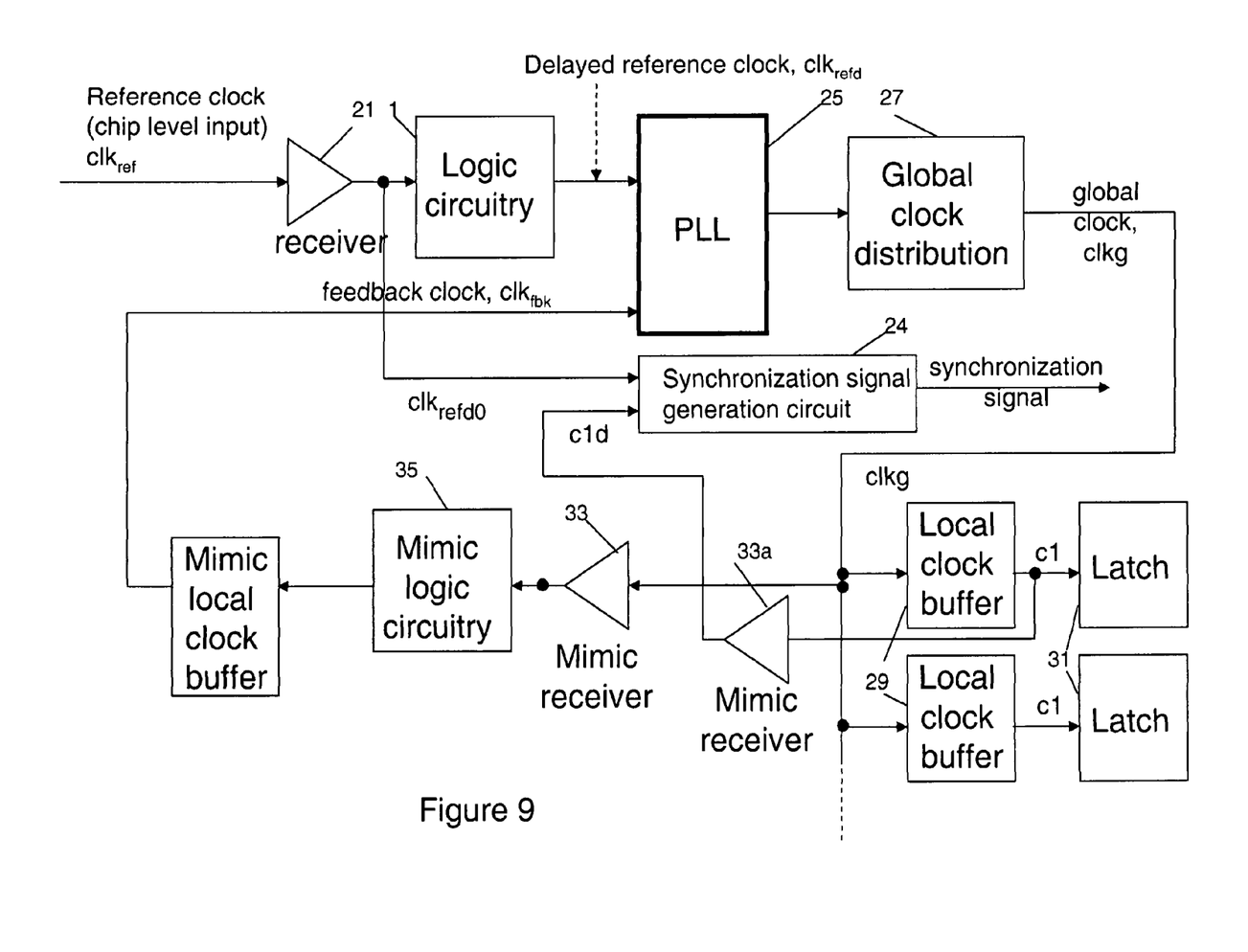
FIG. 9 illustrates one example of synchronization signal generation with reference clock and delayed c1at receiver output.

To implement the scheme described in embodiment II, it is mandatory to place the mimic receiver near the reference clock receiver to minimize the extra phase difference of the two input clocks to synchronization signal generation circuit by unwanted long routing. This is in general feasible because the reference clock chip input pins and receiver are placed close to the target PLL 25. In case this is not easy to achieve at chip floorplanning a more universal way is to use any local clock buffer that is driven by clkg and feed the output, c1, to a mimic receiver as shown in FIG. 9. This way, the clock, cld, is generated independent of the feedback clock path and the associated mimic receiver and local clock buffer may be placed close to reference clock receiver.

The synchronization signal generation circuit can be an edge detection circuit. One example is shown in FIG. 10.

Figure 10:
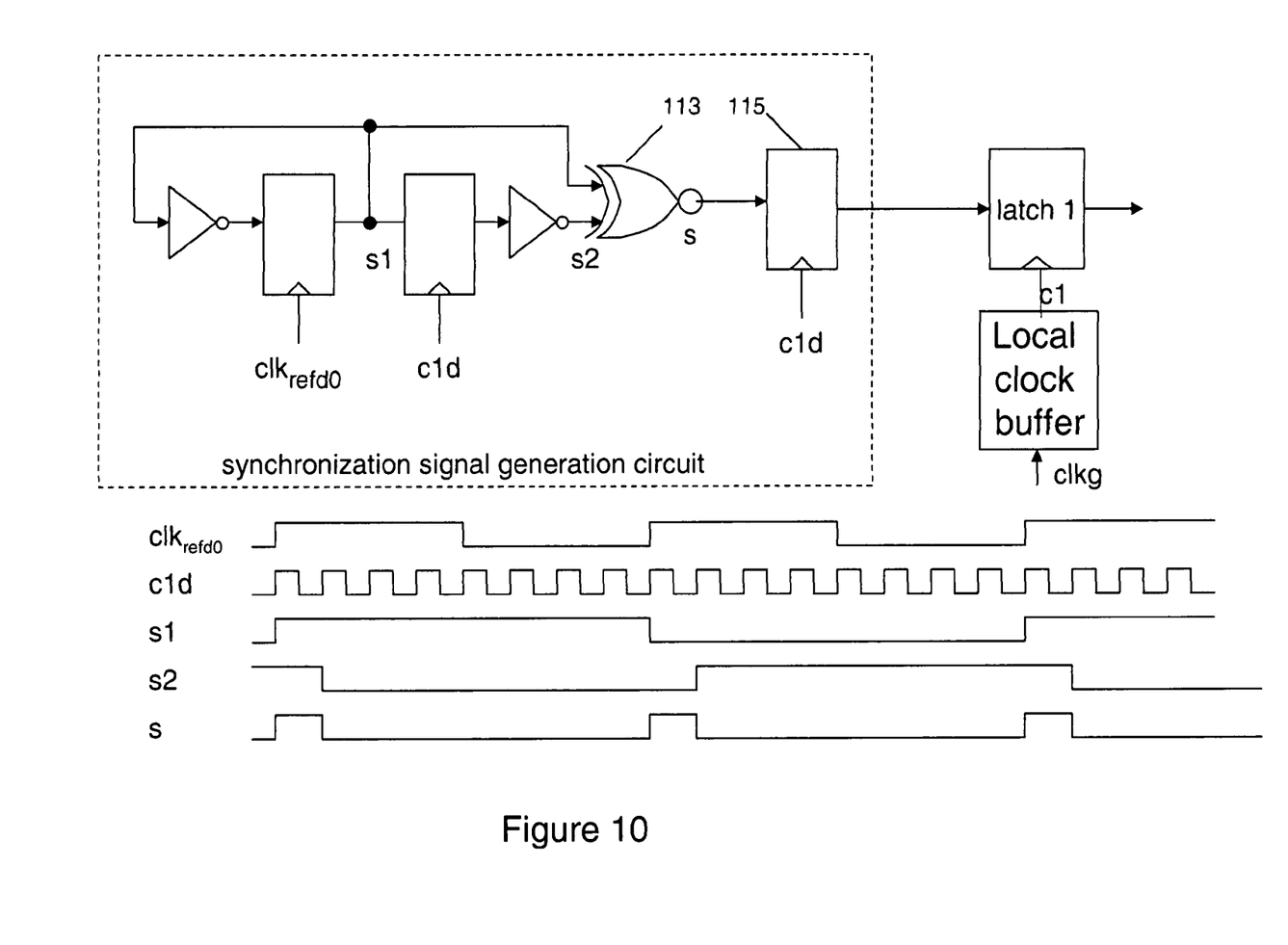
FIG. 10 illustrates one example of an example of synchronization signal generation circuit.

In the example shown in FIG. 10, the first latch 111 clocked by clkrefd0 is a toggle latch that generate s1, whose rising and falling edge correspond to the rising edges of clkrefd0. The XNOR gate 113 generated the synchronization signal, s. The synchronization signal is transferred from synchronization signal generation circuit, which is clocked by cld, to latch 115, which is clocked by c1. There will be no timing concern as the delay of mimic receiver, dr, is only a portion of clkg cycle time.

Figure 11:
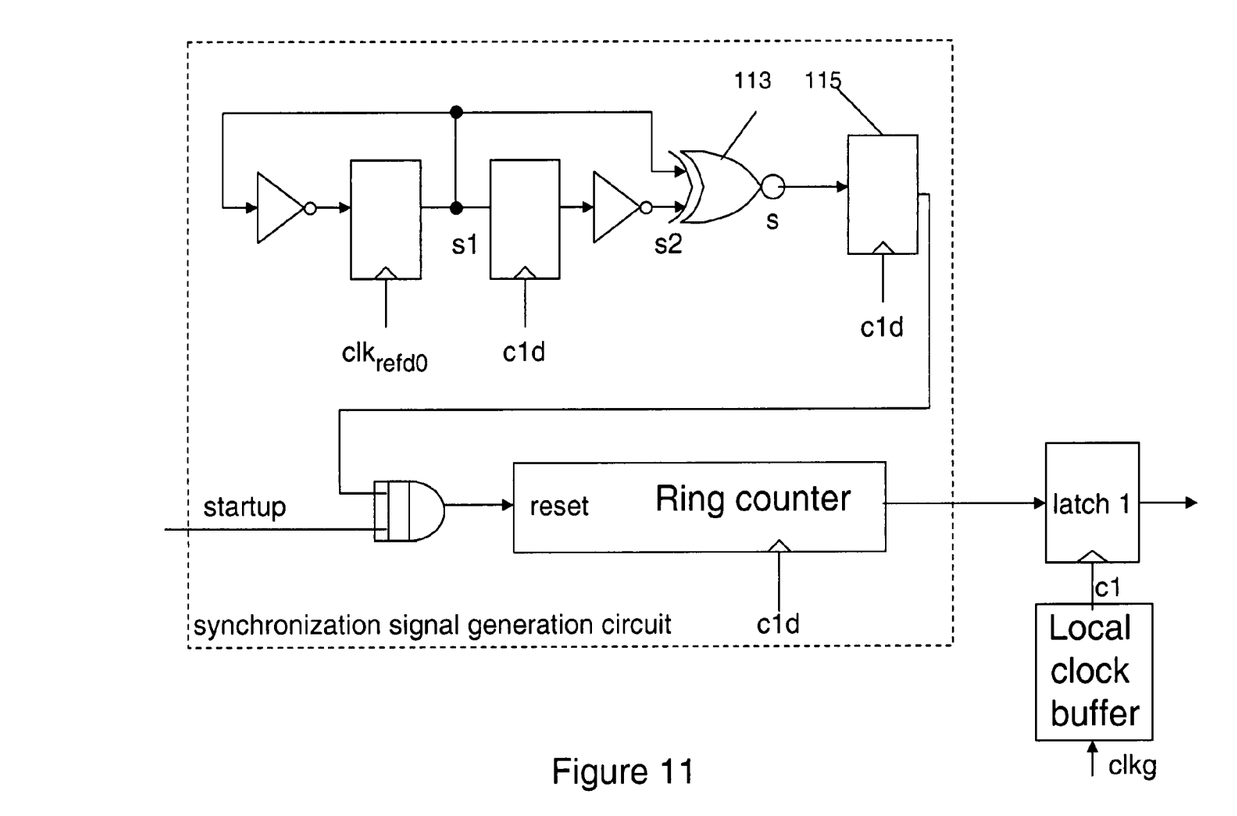
FIG. 11 illustrates one example of an example of free-running synchronization signal generation circuit.

In systems that may have concerns with transient clock jitter of clkg that causes large phase mismatch between clkrefd0 and clkgd, which may result in synchronization signal to be temporarily incorrectly generated, one solution is to use a counter controlled by generated synchronization signal during start up. After the startup period, the counter may be left free running. FIG. 11 shows the implementation of this concept in conjunction with the synchronization signal generation circuit shown in FIG. 11. The startup signal may be controlled by service element that controls the chip operation, or it may come from any valid mode bit on the chip that clearly indicate that the chip is at startup phase.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A clock generator circuit for generating a clock signal for a multiple chip system, comprising:
    a synchronization signal generation circuit, a first latch, and a second latch, the first and second latches being in series with each other and the synchronization signal generation circuit;
    the synchronization signal generation circuit receiving as inputs a delayed reference clock signal and a feedback clock signal and producing a synchronization signal;
    the first latch receiving the synchronization signal and an inverted feedback clock signal as inputs, and producing an output signal as one input signal to the second latch;
    said second latch having as a further input a global clock signal different than the feedback clock signal,
        wherein the synchronization signal generation circuit borrows half a global clock cycle from a path between the first latch and the second latch whereby the path from the first latch to the second latch is a half-cycle path.

2. The clock generator circuit of claim 1 wherein output from the synchronization signal generation circuit is launched with the feedback clock signal.

3. The clock generator circuit of claim 1 wherein the synchronization signal generation circuit is launched with the inverted feedback clock signal.

4. The clock generator circuit of claim 1 comprising a toggle latch clocked by the reference clock signal, an XNOR gate for edge detection, and a latch to generate the synchronization signal.

5. The clock generator circuit of claim 4 comprising a counter controlled by the generated synchronization signal during startup.

* * * * *